United States Patent [19]

Zommer

[11] Patent Number: 4,835,592
[45] Date of Patent: May 30, 1989

[54] SEMICONDUCTOR WAFER WITH DICE HAVING BRIDING METAL STRUCTURE AND METHOD OF MANUFACTURING SAME

[75] Inventor: Nathan Zommer, Palo Alto, Calif.

[73] Assignee: Ixys Corporation, San Jose, Calif.

[21] Appl. No.: 188,197

[22] Filed: Apr. 28, 1988

Related U.S. Application Data

[63] Continuation of Ser. No. 836,244, Mar. 5, 1986, abandoned.

[51] Int. Cl.$^4$ .................. H01L 29/40; H01L 29/60; H01L 49/00
[52] U.S. Cl. ........................................ 357/68; 357/53; 357/52; 357/85
[58] Field of Search .................. 357/68, 53, 85, 52

[56] References Cited

U.S. PATENT DOCUMENTS

| | | | |
|---|---|---|---|
| 3,436,612 | 4/1969 | Grosvalet | 357/53 |
| 3,772,576 | 11/1973 | Nienhuis et al. | 357/53 |
| 4,219,827 | 8/1980 | Kaiser | 357/53 |
| 4,312,011 | 1/1982 | Kanbayashi | 357/53 |
| 4,364,078 | 12/1982 | Smith et al. | 357/52 |
| 4,625,227 | 11/1986 | Hara et al. | 357/53 |
| 4,656,055 | 4/1987 | Dwyer | 357/52 |

OTHER PUBLICATIONS

Hibberd, *Integrated Circuits,* 1969, McGraw-Hill, New York, pp. 136-139.

*Primary Examiner*—Andrew J. James
*Assistant Examiner*—Jerome Jackson, Jr.
*Attorney, Agent, or Firm*—Townsend and Townsend

[57] ABSTRACT

A monolithic semiconductor device and method of manufacturing same having improved high voltage performance. When the device is in wafer form, a metallization structure is formed over scribe zones which are disposed along the scribe lines which define the edge of each device. The scribe zones are normally not covered with oxide during conventional semiconductor fabrication so that an ohmic contact is formed with semiconductor body. The metal structure includes a peripheral section which extend around the active region of each device and extension sections which extend across the scribe lines and interconnect the peripheral sections. The metal structure clamps the voltage at the edge of each device, both prior and subsequent to wafer breaking, which prevents as depletion region created by a reverse-biased junction from extending to the edge of the device under high voltage conditions. As a result, high voltage performance is improved.

11 Claims, 2 Drawing Sheets

SEMICONDUCTOR WAFER WITH DICE HAVING BRIDING METAL STRUCTURE AND METHOD OF MANUFACTURING SAME

This is a continuation of Ser. No. 836,244, filed Mar. 5, 1986, now abandoned.

TECHNICAL FIELD

The present invention relates generally to semiconductor devices and methods of manufacturing same and more particularly to semiconductor devices which incorporate means for preventing depletion regions produced by reverse biased PN junctions in the device from extending to the edge of the die so as to adversely affect high voltage performance.

BACKGROUND ART

A typical monolithic semiconductor device, such as transistors and integrated circuits, usually includes a depletion region formed when an internal PN junction is reversed biased. Under high voltage conditions, the depletion region extends away from the junction a substantial distance, particularly in lightly doped regions.

In the event a depletion region is permitted to extend to the unpassivated edge of a die, the performance of the device is severely degraded. One conventional solution to the foregoing problem is to open a contact area in the oxide layer covering the die and form a separate metallization ring which extends around the active region of the device and maintains the edge of the device at a uniform potential equal to that of the back of the die. One disadvantage of this approach is that additional processing steps must be carried out to form the extra metallization ring. In addition, it is not usually convenient to connect the ring to the back of the die and as a consequence, the die edge is not maintained at an optimum uniform potential.

The present invention overcomes the above-noted limitations of conventional semiconductor devices. A metallization structure is formed which, while providing an ohmic contact with the body region of the device, requires no additional processing steps. In addition, the metallization structure is maintained at the same potential as the back of the die without the requirement of a separate connection. In addition, breakdown voltage measurement and related performance characteristics are substantially the same before and after the scribing and breaking of the wafer so that reliable device testing can be performed in wafer form, thereby reducing manufacturing costs. These and other advantages of the present invention will become apparent to those skilled in the art upon reading the following Best Mode For Carrying Out The Invention together with the drawings.

DISCLOSURE OF THE INVENTION

A monolithic semiconductor device having a semiconductor body and a metal structure on the surface of the body which functions to prevent a depletion region originating in the active region of the device from extending to the edge of the device and method of making same are disclosed. The metal structure includes a peripheral section which extends around the active region of the device and at least one extension section which extends to the edge of the device.

Since the edge of a semiconductor die is typically produced by scribing and breaking a wafer, the unpassivated edge provides an electrical connection between the back of the device and the metallic extension section. Thus, the peripheral section will be at the same potential as the back of the die. The uniform potential at the edge of the die will prevent a depletion region, such as produced by a reversed biased junction present in the device active region, from extending to the edge of the die so as to adversely affect the breakdown voltage and related performance characteristics of the device.

Preferably, the peripheral section is comprised of four interconnected strips, which form a generally rectangular pattern, and which are displaced away from the edge of the die so as not to interfere with the scribing and breaking of the wafer.

A method of fabricating a semiconductor wafer having a plurality of semiconductor devices is also disclosed. The wafer includes a metallization pattern which provides connections to selected points in the active areas of the devices and also function to prevent any depletion region formed in the body of the device from extending to the device edge.

BEST MODE FOR CARRYING OUT THE INVENTION

Figure 1:
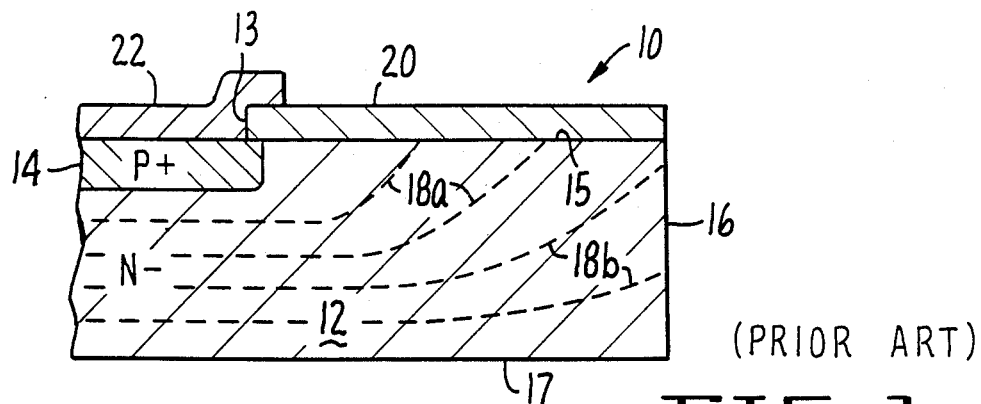
FIG. 1 is an elevated cross-sectional view of a segment of a conventional semiconductor die showing equipotential lines in the N— depletion region which extend to the edge of the die.

Referring now to the drawings, FIG. 1 discloses a segment of an exemplary conventional monolithic semiconductor die, generally designated by the numeral 10. The die includes a lightly doped N— body region 12 which extends to the scribed edge 16 of the die. The top surface 15 of region 10 is covered by an oxide layer 20.

A contact opening 13 is etched in the oxide layer so that a relatively highly doped P+ region 14 can be formed in the top of the die through the opening. A metallization layer 22 is formed over P+ region 14 to form an ohmic contact with the region. Under typical operating conditions, a negative potential may be applied to P+ region 14 with respect to N— region 12. The negative potential reverse biases the PN junction causing a depletion region to be formed on both sides of the junction.

The size of the respective depletion regions, as is well known, is a function of many variables, including the magnitude of the reverse bias potential and the doping level of the semiconductor. The depletion region in lightly doped N− region extends a substantial distance from the PN junction in comparison to the heavily doped P+ region 14.

The depletion region in the N− material is represented by equipotential lines 18. For relatively small voltages, it is possible that the region will extend to the top surface 15 of the die, as represented by equipotential lines 18a. For larger voltages, it is likely that the depletion zone will extend to the edge 16 of the die, as represented by equipotential lines 18b.

Operation of semiconductor device 10 is not adversely affected when the N− depletion region extends only to the top surface 15 of the device. This is because the surface is generally free of contamination and is protected by oxide layer 20. However, when the device is operated at higher voltages and the depletion region propagates vertically along the cleaved edge 16 of the die performance is degraded. Since edge 16 is not passivated, contaminants will invariably be present which will reduce the breakdown voltage and increase leakage current. Operation is also erratic and dependent upon ambient conditions, such as the level of contaminants, humidity and the like. Other well known performance characteristics inherent in devices utilizing planar fabrication technology will also be degraded in the event the depletion region extends to the unpassivated edge 16 of the die.

Figure 2:
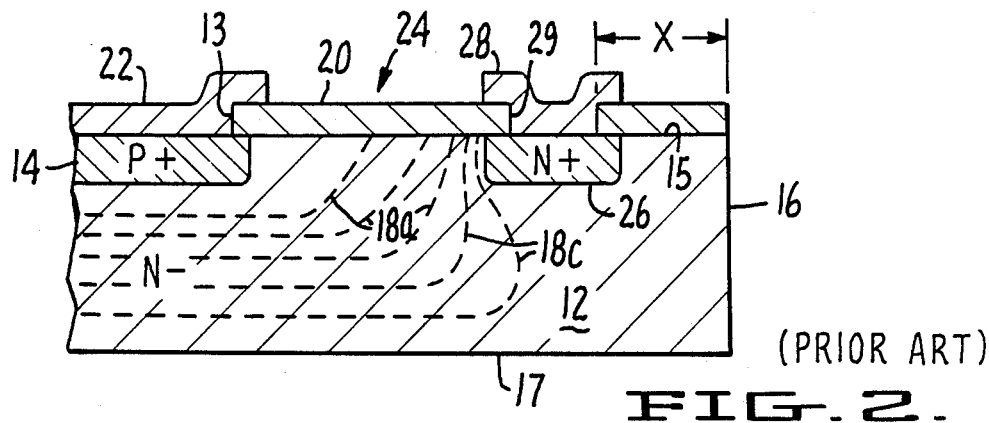
FIG. 2 is an elevated cross-sectional view of a segment of a conventional semiconductor device incorporating an annular ring which tends to prevent the depletion region in the N— material from reaching the edge of the die.

FIG. 2 illustrates one conventional approach for preventing the depletion region from extending to the edge of the die. The voltage at the edge of the die is clamped to a relatively high voltage, typically the same voltage which is applied to the back 17 of the die. Thus, the voltage at the edge 16 of the die, from upper surface 15 down to the bottom 17 of the die, will be at the same potential. Accordingly, no electrical field, such as caused by a depletion region, can be present in the die edge area.

As depicted in FIG. 2, an opening 29 is etched in the oxide layer 20, displaced from the edge 16 of the die, which extends around the die periphery. An N+ contact region 26 is diffused in the N− body region 12 and a metal contact 28 is formed over the contact region to create an ohmic contact.

Ideally, an external electrical connection (not depicted) is made between the bottom 17 of the die and metal contact 28 so that no potential difference exists between the top and bottom surface of the die near the edge. As can be seen in FIG. 2, the equipotential region near the die edge prevents the depletion region from extending to the edge 16 of the die. The equipotential lines 18c, which would normally extend to the edge of the die, are contained by the field and terminate on the passivated top surface 15 of the die rather than the unpassivated edge.

A principal shortcoming of the above-described technique for improving high voltage performance is that additional processing steps are required to add metal contact 28 and associated contact region 26. In addition, is is not practical and/or convenient in most applications to provide an external direct connection between contact 28 and the bottom 17 of the die.

In most applications, metal contact 28 is not directly connected to the back 17 of the die but, rather, is left floating. Because edge 16 of the die presents a low impedance path due to surface contamination, humidity and the like, the top surface 15 of the die, right at the die edge 16, will be generally at the same potential as the die bottom. However, the metal contact 28 is invariably displaced from the edge 16 by a substantial distance represented by X. The surface 15 between contact 28 and edge 16 is passivated and thus does not provide a low impedance path. As a result, metal contact 28 is electrically isolated from edge 16 and does not ensure an equipotential region at the edge die.

A still further shortcoming of the FIG. 2 structure is that there is a substantial divergence between results of breakdown voltage and related tests performed on the device in wafer form and in die form. It is preferable that a device be capable of being tested as thoroughly as possible in wafer form so that defective devices can be eliminated before the expense of packaging is incurred. Until the device of FIG. 2 is packaged, it is not practical to provide a direct external connection between the back 17 of the die under test and metal contact 28. Even if contact 28 is left floating, the potential of the contact with respect to the back of the die will change, depending upon the presence or absence of edge 16. Accordingly, breakdown voltage and related test measurements made prior to wafer breaking will differ substantially after the devices are in die form.

The present invention overcomes the above-noted limitations of conventional semiconductor devices. As is well known, during conventional semiconductor fabrication, the regions between adjacent die on a semiconductor wafer which extend along the orthogonal scribe lines are not covered with oxide during the various diffusion steps and after fabrication of the wafer is completed. Accordingly, these regions, sometimes referred to herein as scribe zone 5, will be doped along with the other active regions of the device. In the case of a semiconductor having an N doped body region, the final diffusion usually causes the semiconductor body in the area of the scribe zone to be N+ doped. As will be subsequently explained, the highly doped scribe zones function as contact areas for an additional metal contact in accordance with the present invention so as to form an ohmic contact. This contact abuts the unpassivated edge of the wafer prior to breaking and the die edge after breaking.

Figure 3:
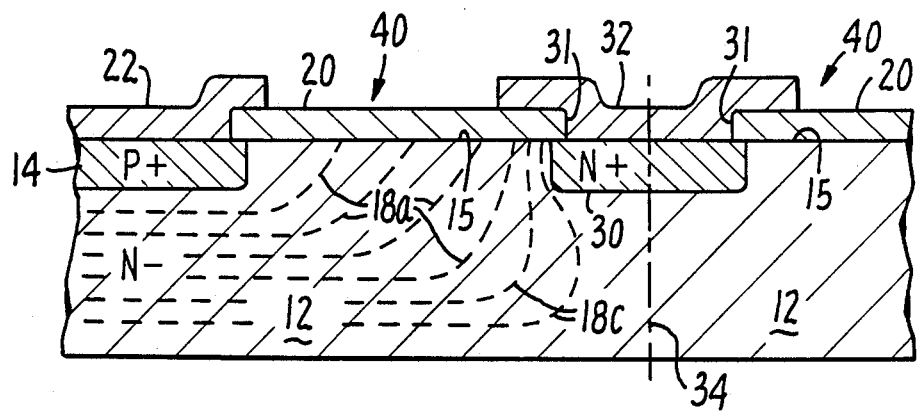
FIG. 3 is an elevated cross-sectional view of a semiconductor wafer in accordance with the subject invention prior to scribing and breaking, showing a metal structure bridging two adjacent dice.

Referring to FIG. 3, a segment of an unbroken semiconductor wafer is shown, including two adjacent devices, each generally designated by the numeral 40. Each device includes N− body region 12 and a diffused P+ 14 region with associated metallization 22. It should be understood that the FIG. 3 device is used only for purposes of illustration and that the present invention is also applicable to semiconductor devices of different polarity types and different geometries.

A scribe zone overlying the scribe line 34 which defines the edges of the device is disposed between edges 31 of the oxide layer 20 overlying the surface 15 of the wafer. As previously noted, the scribe zone remains uncovered during the various diffusion steps used to form the active elements of the device so that the final diffusion will produce a N+ region 30 below the scribe zone. A bridging metal structure 32 is formed over the contact area 30 so as to simultaneously form an ohmic contact with the N− body region 12 of each die and interconnect each die on the wafer. As will be subsequently described, the metal structure extends around the periphery of the device, encircling the active area.

Figure 4:
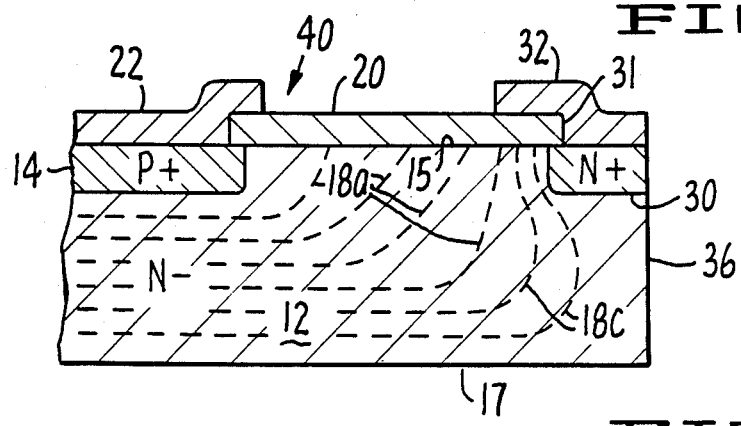
FIG. 4 shows one of the dice of the FIG. 3 structure after scribing and breaking.

FIG. 4 shows a single die 40 after scribing and breaking along the scribe lines 34 (FIG. 3). It can be seen that the divided bridging metal structure 32 extends to the cleaved edge 36 of the die. Accordingly, unpassivated edge 36 directly electrically interconnects metal structure 32 and bottom surface 17. As a result, the periphery of the die, intermediate the upper and lower surfaces is at a uniform potential so as to constrain the depletion region in the N+ body region 12, as represented by equipotential lines 18c.

Figure 5:
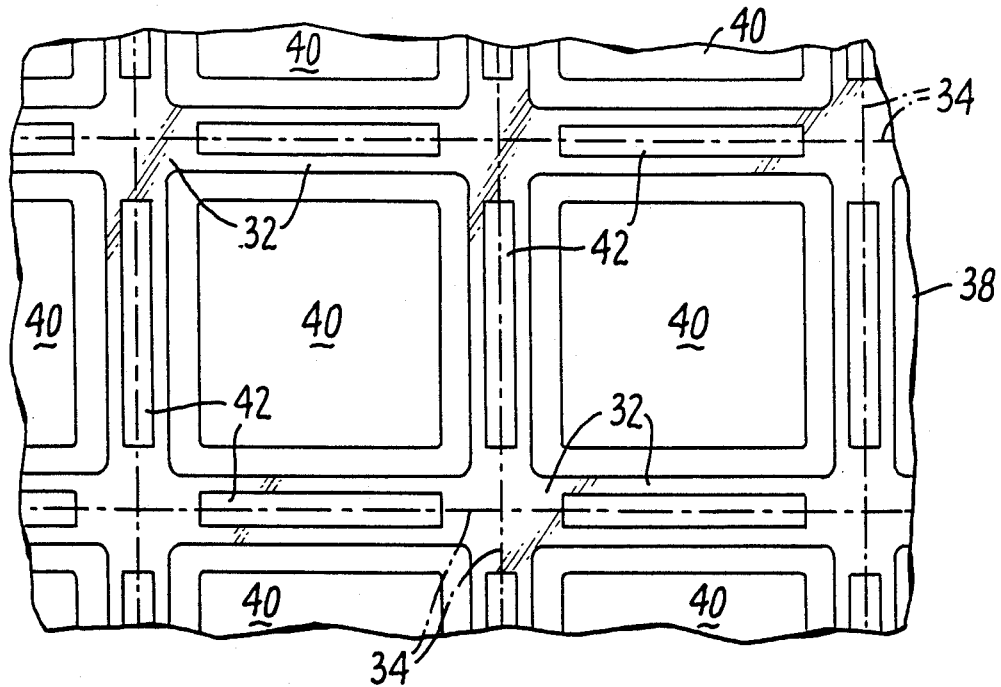
FIG. 5 is a plan view of a semiconductor wafer, in accordance with the subject invention, showing the individual dice and the bridging metal structure.
Figure 6:
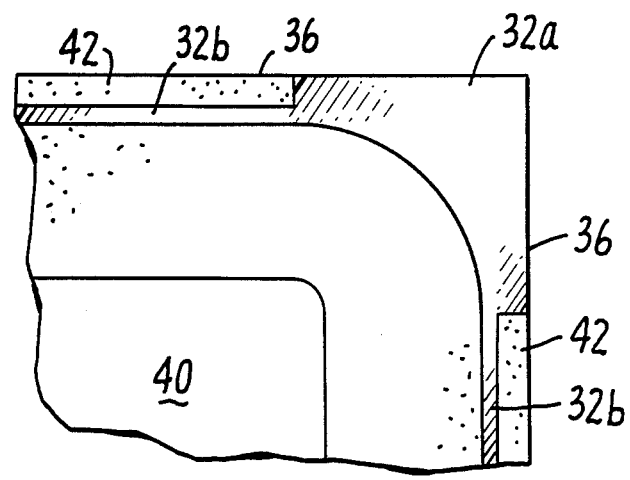
FIG. 6 is a plan view of a corner of one of the dice of the FIG. 5 structure after scribing and breaking.

FIGS. 5 and 6 show further details regarding one embodiment of bridging metal structure 32. FIG. 5 shows a segment of an unscribed wafer which includes adjacent devices 40. The devices are separated by orthogonal scribe lines 34 which define the individual die. Metal structure 32 is disposed along the scribe lines and over the N+ region 30 (FIG. 3) in the scribe zones which follow the scribe lines and which enclose the active regions of each device. Preferably, metallization is etched away along a longitudinal segment of each die to form elongated openings 42. Openings 42 extend along a substantial length of the scribe lines 34 intermediate the devices and facilitate the scribing and breaking of the wafers since metal tends to foul scribing saws and the similar cutting tools. Preferably, less than one half the total length of the edges defining a device are covered with metal.

The bridging metal structure 32 extends over the scribe lines 34 in the regions where the corners of four die 40 converge so that the structure is electrically interconnected over the entire surface of the wafer. Structure 32 extends to the edge 38 of the wafer around the entire wafer circumference. Since the wafer edge is unpassivated, there will be a direct electrical connection between structure 32 and the wafer bottom. Thus, the potential of metal structure 32 will be uniform throughout the surface of the wafer and will be at substantially the same potential prior to and subsequent to wafer breaking. As a consequence, test results prior and subsequent to breaking will be substantially the same.

FIG. 6 shows a section of an individual die 40 from the FIG. 5 wafer after breaking. The bridging metal structure 32 includes an extension section 32a at each corner which extends all the way to the edges 36 of the die. Extension sections 32a function to interconnect the bridge metal structure over the entire wafer surface prior to breaking, and to connect the structure of an individual device, after breaking, to the edge of the die. The extension sections are interconnected by a peripheral section which extends around the periphery of the active region of each device. The peripheral section is comprised of four interconnected metallic strips 32b which are displaced from the edge of the die by virtue of openings 42 so as to reduce the amount of metal to the cut during scribing. Although four separate extension sections 32a are utilized, a single section is adequate to both interconnect the peripheral sections of the metal structure on each device over the entire surface of the wafer and to connect the structure to the back of the die after scribing and breaking. A plurality of extension sections are preferred, however, to ensure a reliable contact with the back of the die.

Figure 7:
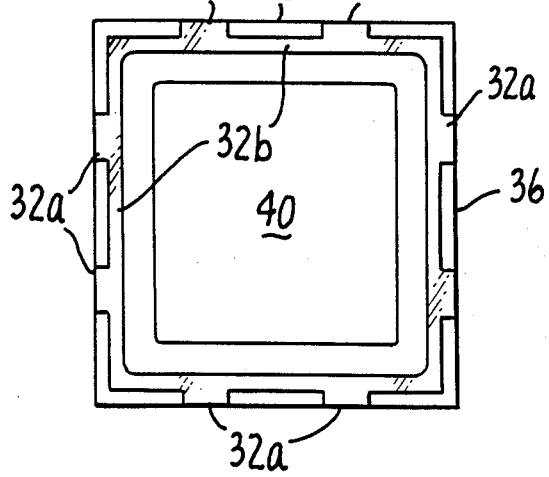
FIG. 7 is a plan view of a semiconductor die after scribing and breaking having a bridging metal structure in accordance with an alternative embodiment of the subject invention.

FIG. 7 shows an alternative embodiment bridging metal structure 32 on an individual die 40 after scribing. A pair of extension sections 32a are disposed along each die edge which cross the scribe line at spaced apart locations along each edge of the die. Again, extension sections 32a function to electrically connect the metal structure to the back of the die after breaking and to interconnect the structures of each die prior to breaking. The metal structure further includes a peripheral section comprised of four interconnected strip segments which interconnect extension sections 32a and maintain the periphery of the die at a uniform potential. The strips are spaced apart from the die edge to facilitate scribing and breaking.

As previously noted, an important advantage of the present invention is that no processing steps in addition to those used in the manufacture of conventional devices are required. A wafer of semiconductor material, usually silicon, is processed in the conventional manner. The active region for each device is formed utilizing conventional processing steps. In the present simplified example, the active region includes P+ region 14 (FIG. 3). An oxide layer is formed over the wafer with selected areas over the active region, such as the area for metal contact 22, being left open by etching and the like. The scribe zones along the scribe lines which surround the active region are also left uncovered during the formation of the active regions. According, contact areas are formed in the scribe zones by virtue of the dopant diffusions used to form the active region of the device. Finally a metallization pattern is formed over the wafer, typically by depositing metal over the entire wafer surface and etching away unwanted material to form the desired pattern. Electrical contacts are thus formed in the active region, such as contact 22, together with metal structure 32 which is formed over region 30 in the scribe zone. Preferably, contact 22 and structure 32 are formed simultaneously.

Thus, two embodiments of a novel semiconductor device have been disclosed. Although the embodiments have been described in some detail, various changes could be made by those skilled in the art without departing from the spirit and scope of the invention as defined by the appended claims.

What is claimed is:

1. A semiconductor die comprising:
   a semiconductor body of selected conductivity having an upper surface which includes at least one active region, the body having a peripheral edge;
   a contact region of greater conductivity than the selected conductivity, the contact region surrounding the semiconductor body and extending into the semiconductor body from the upper surface and extending to the peripheral edge in at least one region; and
   an electrically conductive metal structure disposed on the upper surface on the contact region, the electrically conductive metal structure extending to the peripheral edge in the at least one region and extending completely around the semiconductor body.

2. A semiconductor die as in claim 1 wherein the electrically conductive metal structure comprises four interconnected strips forming a generally rectangular pattern.

3. A semiconductor die as in claim 2 wherein the strips are displaced from the peripheral edge of the semiconductor body.

4. A semiconductor die as in claim 3 wherein the electrically conductive metal structure includes a plurality of extension sections, each one of which extends to the peripheral edge of the semiconductor body at spaced-apart locations along the edge.

5. A semiconductor die as in claim 4 wherein the upper surface is generally rectangular and the plurality of extension sections includes at least one extension section extending from the electrically conductive metal structure to each of the edges.

6. A semiconductor die as in claim 2 wherein the interconnected strips intersect to form four corners and an extension section extends from each of the corners to the peripheral edge of the semiconductor body.

7. A semiconductor die as in claim 1 wherein the electrically conductive metal structure is ohmically connected to the contact region.

8. A semiconductor wafer comprising:
a plurality of integrated circuits formed in the wafer, each circuit including a central portion and a periphery, the periphery of each circuit being separated on the wafer from every other circuit so as to define scribe lines therebetween;
a contact region of greater conductivity than the wafer, the contact region extending into the wafer beneath the scribe lines, and not extending into the central portion; and
an electrically conductive structure disposed on the contact region and not on the central portion, and extending to the scribe lines in at least one location on each circuit.

9. A wafer as in claim 8 wherein the electrically conductive structure only intermittently extends to the scribe lines yet forms a continuous boundary around the central portion of each of the integrated circuits.

10. A wafer as in claim 8 wherein the electrically conductive structure is ohmically connected to the contact region.

11. A wafer as in claim 10 wherein each of the circuits is rectangular and the scribe lines form an orthogonal pattern.

* * * * *